(12) United States Patent
Ito

(10) Patent No.: US 9,742,595 B2
(45) Date of Patent: Aug. 22, 2017

(54) RECEPTION APPARATUS

(71) Applicant: Hitachi Kokusai Electric Inc., Tokyo (JP)

(72) Inventor: Kei Ito, Tokyo (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 0 days.

(21) Appl. No.: 15/463,615

(22) Filed: Mar. 20, 2017

(65) Prior Publication Data

US 2017/0195144 A1 Jul. 6, 2017

Related U.S. Application Data

(63) Continuation-in-part of application No. PCT/JP2015/075324, filed on Sep. 7, 2015.

(30) Foreign Application Priority Data

Oct. 28, 2014 (JP) .................. 2014-219371

(51) Int. Cl.
*H03H 7/30* (2006.01)
*H04L 25/03* (2006.01)
(Continued)

(52) U.S. Cl.
CPC ...... *H04L 25/03019* (2013.01); *H04L 1/0071* (2013.01); *H04L 5/0007* (2013.01);
(Continued)

(58) Field of Classification Search
CPC ............. H04L 25/03171; H04L 5/0007; H04L 2025/03414; H04L 25/022;
(Continued)

(56) References Cited

U.S. PATENT DOCUMENTS

2006/0206776 A1* 9/2006 Nieto ................ H03M 13/2957
714/755
2013/0114765 A1* 5/2013 Annavajjala .......... H04L 5/0048
375/341

(Continued)

FOREIGN PATENT DOCUMENTS

JP 2007-526719 A 9/2007
JP 2009-532957 A 9/2009

OTHER PUBLICATIONS

International Search Report and Written Opinion from International Application No. PCT/JP2015/075324 dated Oct. 27, 2015, with English translation.

(Continued)

*Primary Examiner* — Leila Malek
(74) *Attorney, Agent, or Firm* — Brundidge & Stanger, P.C.

(57) ABSTRACT

When a channel between a transmission apparatus and a reception apparatus is distorted by multipath fading or other reasons, linear interpolation between pilot subcarriers produces a large estimation error, resulting in an increase in an equalization error and a decrease in reception performance. The present invention allows feedback of a signal that undergoes error correction, reduction in the channel estimation error through repeated channel estimation, and improvement in the reception performance.

4 Claims, 3 Drawing Sheets

(51) Int. Cl.
*H04L 1/00* (2006.01)
*H04L 5/00* (2006.01)

(52) U.S. Cl.
CPC .................. *H04L 25/03171* (2013.01); *H04L 2025/03414* (2013.01)

(58) Field of Classification Search
CPC ......... H04L 25/03159; H04L 25/03318; H04L 1/0071; H04L 27/22; H04L 27/2636
USPC ....... 375/232, 267, 340, 346, 229, 316, 341; 714/746
See application file for complete search history.

(56) References Cited

U.S. PATENT DOCUMENTS

| | | | | |
|---|---|---|---|---|
| 2013/0142158 | A1* | 6/2013 | Hamaguchi | H04L 5/0044 370/329 |
| 2014/0153625 | A1* | 6/2014 | Vojcic | H04L 1/005 375/224 |
| 2016/0065329 | A1* | 3/2016 | Stopler | H04L 1/0047 714/776 |

OTHER PUBLICATIONS

Mori, et al., BLER Performance of Star16QAM Using Iterative Decision-Directed Channel Estimation for DFT-Precoded OFDMA, IEICE Technical Report RCS, Musen Tsushin System, 112 (443), Feb. 20, 2013, pp. 201-206.

Takeuchi, et al., Iterative LMMSE Channel Estimation and Decoding Based on Probabilistic Bias, Communications, IEEE Transactions on, Sep. 2013, pp. 1-11.

Liu, et al., A Joingt Algorithm of Iterative Equalization and Iterative Channel Estimation in SC-FDE System, TENCON 2013—2013 IEEE Region 10 Conference, (31194), Oct. 25, 2014, pp. 1-5.

* cited by examiner

RECEPTION APPARATUS

CROSS-REFERENCE TO RELATED APPLICATION

The present application is a continuation-in-part application under 35 U.S.C §111 (a) of International Application No. PCT/JP2015/075324, filed Sep. 7, 2015, which claims priority to Japanese Patent Application No. 2014-219371, filed Oct. 28, 2014. The contents of these applications are incorporated herein by reference in their entirety.

TECHNICAL FIELD

The present invention relates to a reception apparatus.

BACKGROUND ART

In an equalization process of a reception apparatus in wireless communications, in general, in multi-carrier communication such as orthogonal frequency-division multiplexing (OFDM) scheme, a transmission apparatus inserts pilot subcarriers with amplitude and phase already known at specified intervals in a subcarrier direction, and the reception apparatus performs linear interpolation between the pilot subcarriers to estimate a channel between the transmission apparatus and the reception apparatus, and then multiplies a reception signal by an inverse characteristic of estimated channel information to perform equalization.

As a prior art literature, for example, Patent Literature 1 discloses an invention of new channel estimation that produces reliable channel estimation even when data values to be decoded are likely to produce detection errors. In addition, as another prior art literature, for example, Patent Literature 2 discloses an invention of a multi-carrier reception apparatus that provides an accurate channel estimation value even under environments where frequency selective fading occurs and dynamic fading occurs that undergoes Doppler frequency fluctuation.

CITATION LIST

Patent Literature

Patent Literature 1: Japanese Patent No. 4272665
Patent Literature 2: Japanese Patent No. 3876437

SUMMARY OF INVENTION

Technical Problem

According to conventional technologies, when the channel between the transmission apparatus and the reception apparatus is distorted by multipath fading or other reasons, linear interpolation between pilot subcarriers produces a large estimation error, resulting in increase in an equalization error and decrease in reception performance.

Solution to Problem

A reception apparatus of the present invention includes: a fast Fourier transform unit configured to convert a received time signal into a frequency signal; a pilot subcarrier extraction unit configured to extract a pilot subcarrier from the frequency signal; a channel estimation unit configured to estimate a channel between transmission and reception by performing a linear interpolation process on a pilot subcarrier extraction signal extracted by the pilot subcarrier extraction unit; an equalization unit configured to perform equalization using the frequency signal and a result of the channel estimation; a bit log likelihood ratio calculation unit configured to calculate a bit log likelihood ratio from output of the equalization; a deinterleave unit configured to rearrange the bit log likelihood ratio in original order, the deinterleave unit making a pair with an interleave section that rearranges the bit log likelihood ratio in order determined in advance on a transmission side; a soft-in soft-out decoding unit configured to perform error correction of soft-in soft-out on output of the deinterleave; an interleave unit configured to rearrange an encoded bit log likelihood ratio in order similar to order on a transmission side out of output of a section of the soft-in soft-out error correction; a soft symbol calculation unit configured to generate a soft symbol from output of the interleave; a hard decision unit configured to perform hard decision on the generated soft symbol; and a reliability evaluation unit configured to generate reliability information from the encoded bit log likelihood ratio of output of the interleave.

In addition, the reception apparatus of the present invention is the reception apparatus as described above, in which the channel estimation unit includes a linear interpolation unit configured to perform a linear interpolation process on output of the soft symbol hard decision when the reliability information is larger than a predetermined threshold.

Moreover, the reception apparatus of the present invention is the reception apparatus as described above, in which the channel estimation unit repeats the linear interpolation process until the reliability information becomes smaller than the predetermined threshold.

Advantageous Effects of Invention

The present invention allows feedback of a signal that undergoes error correction, reduction in the channel estimation error through repeated channel estimation, and improvement in the reception performance.

DESCRIPTION OF EMBODIMENTS

Figure 1:
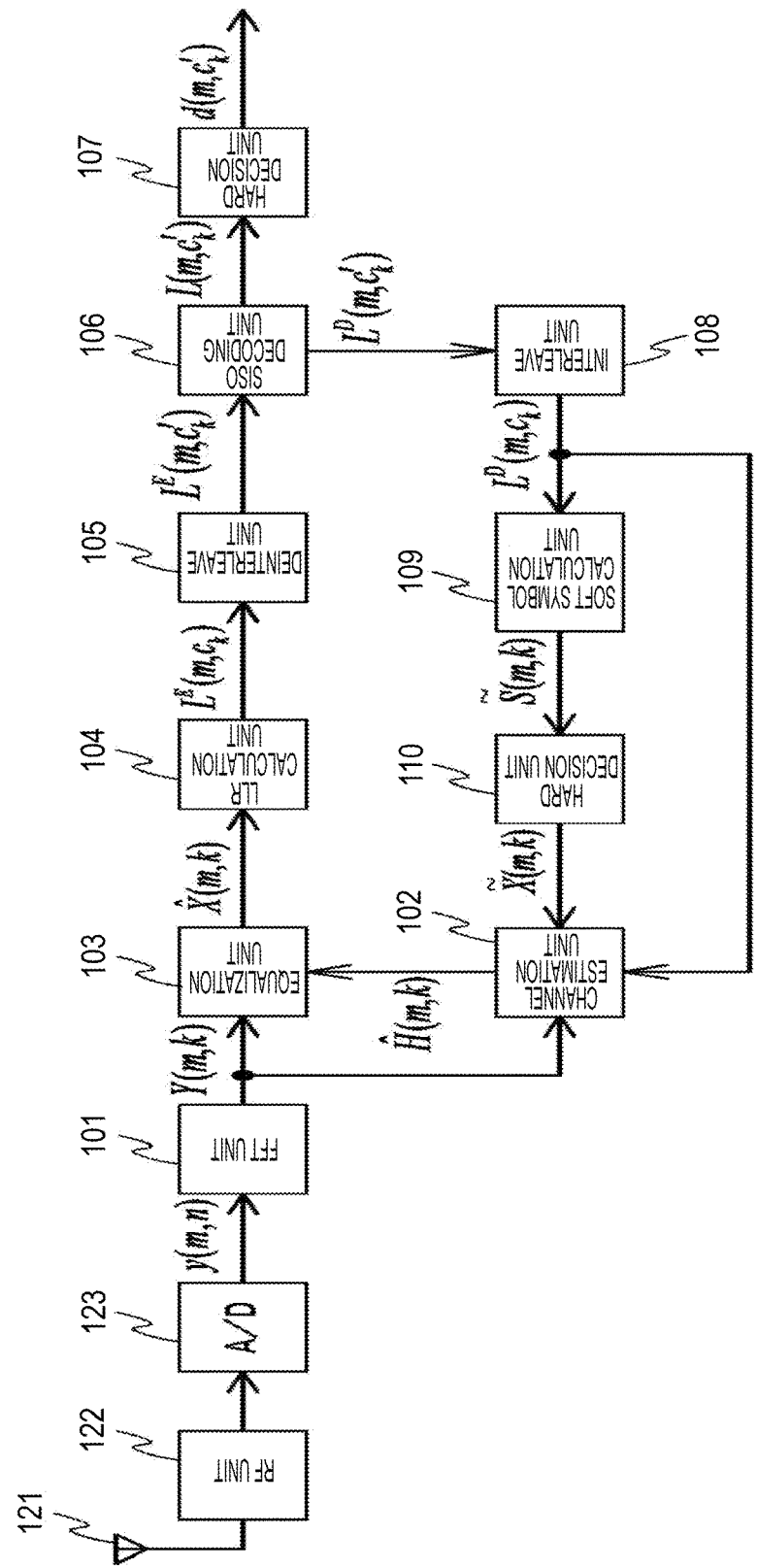
FIG. 1 is a block diagram illustrating a configuration of a reception apparatus according to one embodiment of the present invention.

One embodiment of the present invention will be described below with reference to the drawings. FIG. 1 is a block diagram illustrating a configuration of a reception apparatus according to one embodiment of the present invention. In FIG. 1, the reception apparatus includes an antenna 121, a radio frequency (RF) unit 122, an analog-to-digital converter (A/D) unit 123, a fast Fourier transform (FFT) unit 101, a channel estimation unit 102, an equalization unit 103, a log likelihood ratio (LLR) calculation unit 104, which is a bit log likelihood ratio calculation unit, a deinterleave unit 105, a soft-in soft-out (SISO) decoding unit 106, a hard decision unit 107, an interleave unit 108, a soft symbol calculation unit 109, and a hard decision unit 110.

The antenna 121 receives a wireless signal transmitted from a transmission side, the RF unit 122 converts the reception signal into a baseband signal, and the A/D unit 123 converts the baseband signal into a digital signal. The reception signal is an OFDM signal, for example. The FFT unit 101 converts a received time domain signal y (m, n) into a frequency domain signal, and outputs the converted signal as a reception frequency signal Y (m, k) to the channel estimation unit 102 and the equalization unit 103. Here, m denotes a symbol number, n denotes a sample number, and k denotes a subcarrier number.

Based on the incoming reception frequency signal Y (m, k), a frequency signal acquired by performing hard decision on a soft symbol that undergoes error correction and feedback, and a reception bit log likelihood ratio (LLR) $L^D$ (m, $c_k$) that undergoes error correction and feedback, the channel estimation unit 102 estimates a channel between the transmission apparatus and the reception apparatus, and outputs a channel estimation result to the equalization unit 103. Here, $c_k$ denotes a bit series number after an interleave process.

Figure 2:
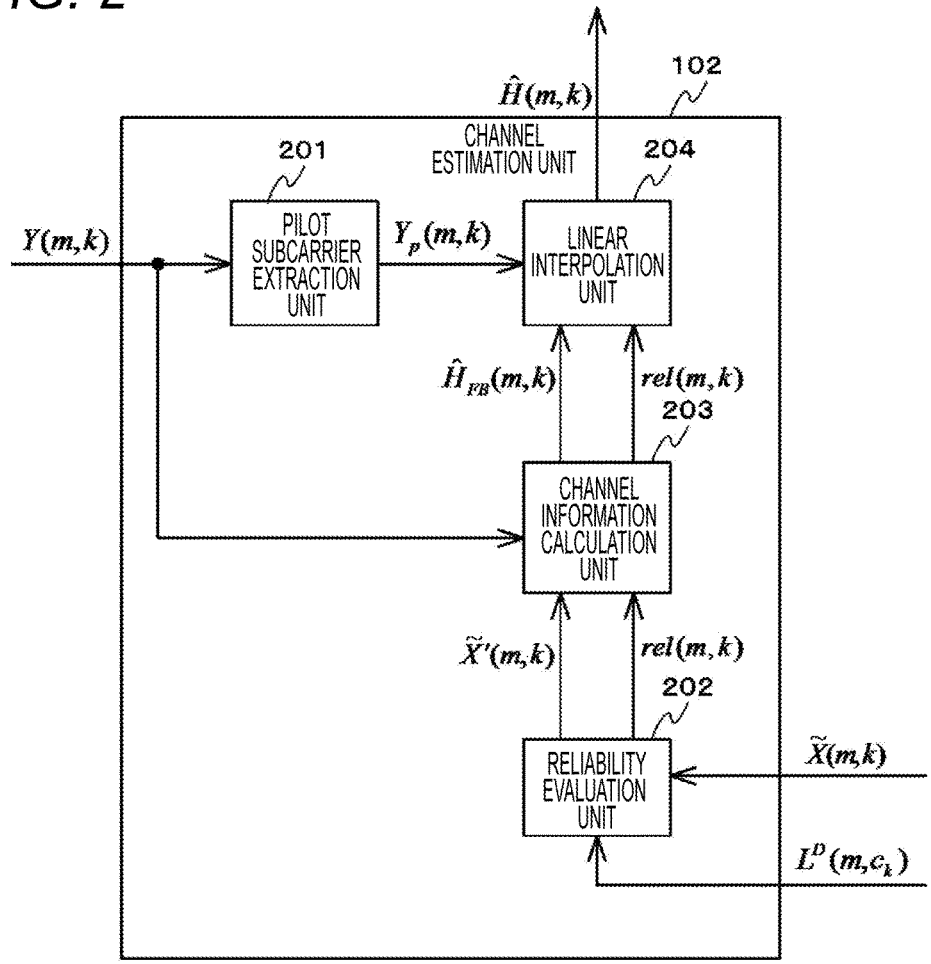
FIG. 2 is a functional block diagram illustrating a configuration of a channel estimation unit of the reception apparatus according to one embodiment of the present invention.

Next, an operation of the channel estimation unit 102 will be described with reference to FIG. 2. In FIG. 2, the channel estimation unit 102 includes a pilot subcarrier extraction unit 201, a reliability evaluation unit 202, a channel information calculation unit 203, and a linear interpolation unit 204.

The pilot subcarrier extraction unit 201 extracts a pilot subcarrier from the incoming reception frequency signal Y (m, k), and then outputs a reception frequency signal $Y_p$ (m,—k) from which the pilot subcarrier is extracted to the linear interpolation unit 204. The pilot subcarrier extraction unit 201 extracts the pilot subcarrier, for example, by replacing subcarriers other than the pilot subcarrier by '0' among all the subcarriers.

[Mathematical Formula 1]

The reliability evaluation unit 202 evaluates reliability of an incoming signal $\tilde{X}(m,k)$ that undergoes error correction and feedback based on a similarly incoming bit LLR $L^D$ (m, $c_k$). When it is determined that the reliability is high, this signal will be $\tilde{X}(m,k)$, and otherwise this signal will be zero. The reliability evaluation unit 202 outputs the signal after the reliability evaluation $\tilde{X}'(m,k)$ and a reliability evaluation result signal rel (m, k) to the channel information calculation unit 203. The signal after the reliability evaluation $\tilde{X}'(m,k)$ is expressed by Mathematical Formula 1.

$$\tilde{X}'(m, k) = \begin{cases} \tilde{X}(m, k) | rel(m, k) = 1 \\ 0 \qquad | rel(m, k) = 0 \end{cases} \quad \text{(Mathematical Formula 1)}$$

Here, rel (m, k) denotes the reliability evaluation result signal, and the reliability evaluation result signal rel (m, k) is expressed by Mathematical Formula 2, for example.

[Mathematical Formula 2]

$$rel(m, k) = \begin{cases} 0 \left| \prod_{b=1}^{D} |L^D(m, B \cdot k + b - 1)| < thr \right. \\ 1 \left| \prod_{b=1}^{B} |L^D(m, B \cdot k + b - 1)| \geq thr \right. \end{cases} \quad \text{(Mathematical Formula 2)}$$

Here, B denotes the number of modulation bits in the modulation scheme, whereas thr denotes a reliability evaluation threshold. As the reliability evaluation threshold thr, for example, a value of size that causes no hard decision error is set. If there is even one bit with low likelihood (LLR is close to zero), an infinite product of LLRs is calculated to decrease an absolute value of rel (m, k).

[Mathematical Formula 3]

The channel information calculation unit 203 calculates channel information $\hat{H}_{FB}(m,k)$ obtained from reliable (rel (m, k)=1) fed-back data subcarrier by using the incoming reception frequency signal Y (m, k), the signal that undergoes error correction and feedback $\tilde{X}'(m,k)$, and the reliability evaluation result signal rel (m, k). The channel information calculation unit 203 then outputs the channel information $\hat{H}_{FB}(m,k)$ and the reliability evaluation result signal rel (m, k) to the linear interpolation unit 204. The channel information calculation unit 203 calculates the channel information $\hat{H}_{FB}(m,k)$, for example, by Mathematical Formula 3.

$$\hat{H}_{FB}(m, k) = \frac{Y(m, k)}{\tilde{X}'(m, k)} \quad \text{(Mathematical Formula 3)}$$

The linear interpolation unit 204 estimates the channel between the transmission apparatus and the reception apparatus by using the pilot subcarrier-extracted incoming reception frequency signal $Y_p$ (m, k), the channel information obtained from the fed-back signal $\hat{H}_{FB}(m,k)$, and the reliability evaluation result signal rel (m, k). The linear interpolation unit 204 then outputs the channel estimation result $\hat{H}(m,k)$ to the equalization unit 103.

Figure 3:
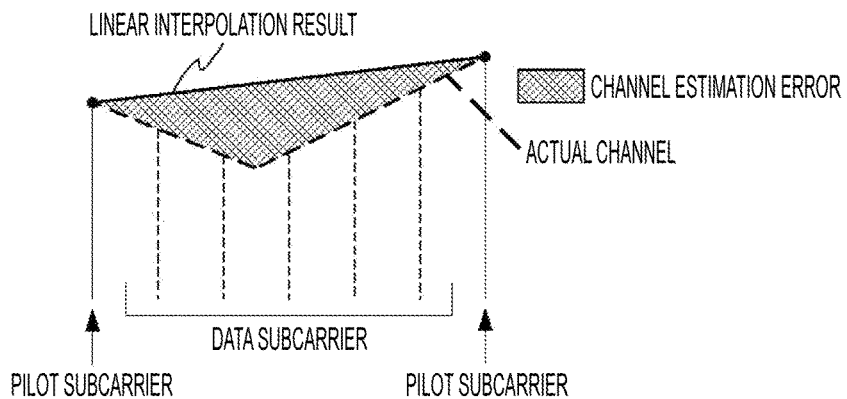
FIG. 3 is a diagram illustrating linear interpolation of the channel estimation unit.

Next, typical linear interpolation of wireless communications will be described with reference to FIG. 3. FIG. 3 is a diagram illustrating linear interpolation of the channel estimation unit 102. In FIG. 3, the channel estimation unit 102 estimates the channel by performing linear interpolation between the pilot subcarriers. However, variations between the pilot subcarriers cause a channel estimation error in the actual channel.

Figure 4:
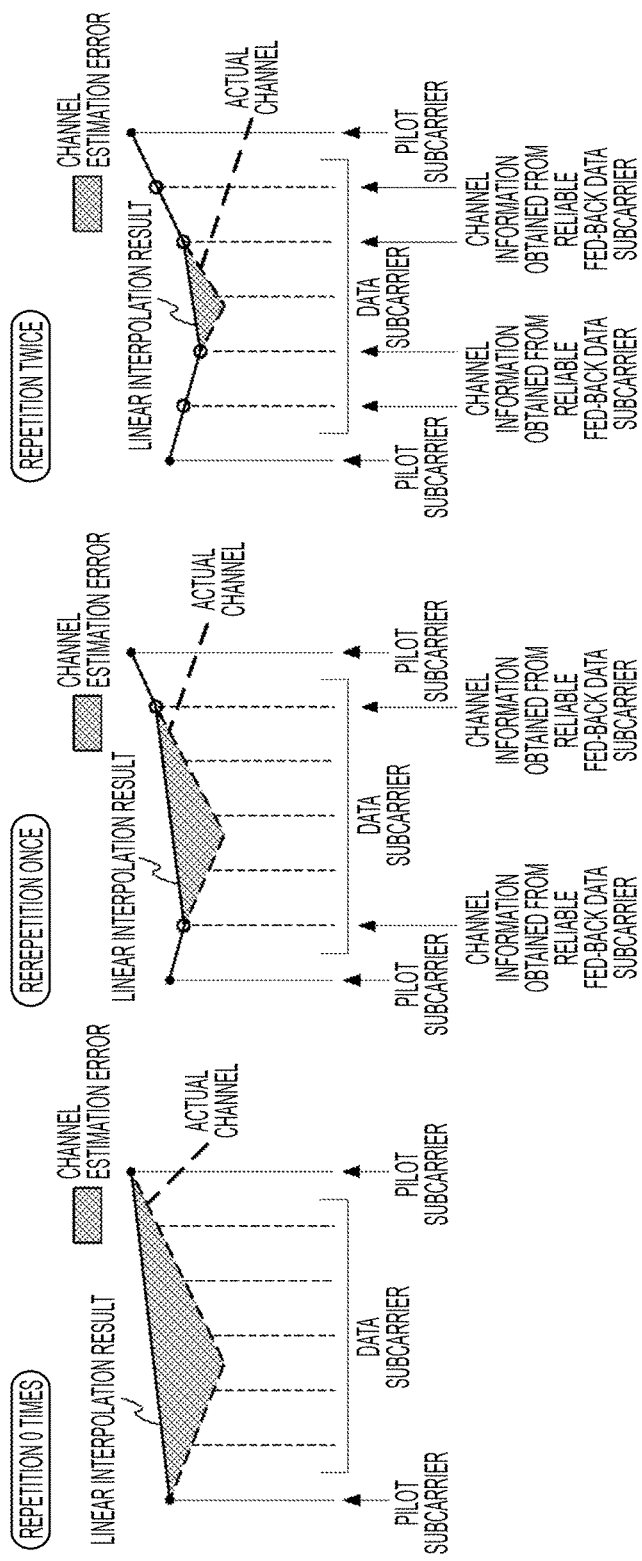
FIG. 4 is a diagram illustrating repeated linear interpolation of the channel estimation unit of the reception apparatus according to one embodiment of the present invention.

Next, linear interpolation, which is one embodiment of the present invention, will be described with reference to FIG. 4. FIG. 4 is a diagram illustrating repeated linear interpolation of the channel estimation unit 102 of the reception apparatus according to one embodiment of the present invention.

[Mathematical Formula 4]

FIG. 4 illustrates one example of linear interpolation when there is feedback, which is one embodiment of the present invention. In addition to each pilot subcarrier, linear interpolation is performed using the channel information $\hat{H}_{FB}(m,k)$ obtained from the reliable (rel (m, k)=1) fed-back data subcarrier, and thus the channel estimation error can be reduced as compared with a conventional scheme.

The equalization unit 103 calculates equalization output $\hat{X}(m,k)$, for example, by Mathematical Formula 4 using the incoming reception frequency signal Y (m, k) and the interpolated channel estimation result $\hat{H}(m,k)$.

$$\hat{X}(m, k) = \frac{Y(m, k)}{\hat{H}(m, k)} \quad \text{(Mathematical Formula 4)}$$

The LLR calculation unit 104 calculates a reception bit LLR $L^E$ (m, $c_k$), for example, by calculating a distance between the incoming equalization output $\hat{X}(m,k)$ and an ideal point in each bit. The LLR calculation unit 104 then outputs the reception bit LLR $L^E$ (m, $c_k$) to the deinterleave unit 105. The LLR calculation unit 104 calculates the reception bit LLR, for example, by Mathematical Formula 5.

$$L^E(m, c_k) = \log \frac{\sum_{i=0}^{Q-1} X(i) \in (c_k = 0) \exp\left(-\frac{|X(i) - \hat{X}(m,k)|^2}{2\sigma^2}\right)}{\sum_{i=0}^{Q-1} X(i) \in (c_k = 1) \exp\left(-\frac{|X(i) - \hat{X}(m,k)|^2}{2\sigma^2}\right)}$$

(Mathematical Formula 5)

Here, X(i) denotes a mapping value of the modulation scheme at mapping number i, whereas Q denotes the number of mapping points of the modulation scheme. Here, an approximate expression is Mathematical Formula 6.

[Mathematical Formula 6]

$$\sum_i \exp(z_i) \cong \max(z_i)$$

(Mathematical Formula 6)

Approximation of Mathematical Formula 5 with Mathematical Formula 6 produces Mathematical Formula 7.

[Mathematical Formula 7]

$$L^E(m, c_k) = \frac{\max_{X(i) \in (c_k=0)} |X(i) - \hat{X}(m,k)|^2 - \max_{X(i) \in (c_k=1)} |X(i) - \hat{X}(m,k)|^2}{2\sigma^2}$$

(Mathematical Formula 7)

By the above Mathematical Formula, the reception bit LLR is calculated using a minimum distance between 1 and the bit to which attention is paid and a minimum distance between 0 and the bit.

The deinterleave unit 105 returns a series of the incoming reception bit LLR $L^E$ (m, $c_k$) obtained through rearrangement in order determined in advance on a transmission side to original order, and then outputs the reception bit LLR $L^E$ (m, $c'_k$) rearranged to the original order to the SISO decoding unit 106. Here, $c'_k$ is a bit information series number before the interleave process. A unit of the interleave and deinterleave process of this example is in agreement with a unit of an OFDM symbol or an integral submultiple of the OFDM symbol (that is, a total number of bits assigned to data subcarrier in one OFDM symbol is a natural multiple of an interleave length).

The SISO decoding unit 106 performs the error correction process of soft-in soft-out on the incoming reception bit LLR $L^E$ (m, $c'_k$), outputs the information bit LLR L (m, $c'_k$) that undergoes the error correction to the hard decision unit 107, and outputs an encoded bit LLR $L^D$ (m, $c'_k$) that undergoes the error correction to the interleave unit 108. The SISO error correction process can be implemented, for example, by a method using maximum aposteriori probability based on a BCJR (Bahl, Cocke, Jelinek, Raviv: designers' initials) algorithm or a method based on SOVA (Soft Output Viterbi Algorithm).

The hard decision unit 107 performs the hard decision process on the incoming information bit LLR L (m, $c'_k$) and outputs a reception information bit d' (m, $c'_k$) that undergoes the hard decision process. The hard decision process is performed, for example, by Mathematical Formula 8.

[Mathematical Formula 8]

$$d'(m, c'_k) = \begin{cases} 0 \mid L(m, c'_k) \geq 0 \\ 1 \mid L(m, c'_k) < 0 \end{cases}$$

(Mathematical Formula 8)

The interleave unit 108 rearranges the incoming encoded bit LLR $L^D$ (m, $c'_k$) in order determined in advance similar to order on a transmission side, and then outputs the rearranged encoded bit LLR $L^D$ (m, $c_k$) to the soft symbol calculation unit 109 and the channel estimation unit 102.

[Mathematical Formula 9]

The soft symbol calculation unit 109 calculates the soft symbol $\tilde{S}(m,k)$ by using the incoming encoded bit LLR $L^D$ (m, $c_k$), and then outputs the calculated soft symbol $\tilde{S}(m,k)$ to the hard decision unit 110. The soft symbol calculation unit 109 calculates the soft symbol $\tilde{S}(m,k)$, for example, by the following procedure. First, the soft symbol calculation unit 109 calculates bit probability $p_0$ (m, $c_k$) of 0 and $p_1$ (m, $c_k$) of 1 by Mathematical Formula 9 and Mathematical Formula 10 from the encoded bit LLR $L^D$ (m, $c_k$).

$$p_0(m, c_k) = \frac{1}{1 + e^{-L^D(m,c_k)}}$$

(Mathematical Formula 9)

$$p_1(m, c_k) = \frac{1}{1 + e^{L^D(m,c_k)}}$$

(Mathematical Formula 10)

Next, the soft symbol calculation unit 109 calculates mapping probability P (m, i) by Mathematical Formula 10 using the bit probability $P_0$ (m, $c_k$) and $P_1$ (m, $c_k$).

[Mathematical Formula 10]

$$P(m, i) = \prod_{b=1}^{B} p_{g(i,B-b)}(m, B \cdot k + b - 1)$$

(Mathematical Formula 11)

Here, g (i, z) is a z-th bit value when counted from a least significant bit when a mapping point number i is expressed in binary.

[Mathematical Formula 11]

Finally, the soft symbol calculation unit 109 calculates) the soft symbol $\tilde{S}(m,k)$ by Mathematical Formula 12 using the mapping probability p (m, i) and mapping value X (i).

$$\tilde{S}(m, k) = \sum_{i=0}^{Q-1} P(m, i) \cdot X(i)$$

(Mathematical Formula 12)

The hard decision unit 110 performs hard decision on the) incoming soft symbol $\tilde{S}(m,k)$, and then outputs a result of the hard decision $\tilde{X}(m,k)$ to the channel estimation unit 102. In the hard decision, the hard decision unit 110 selects, for example, a point with a minimum distance between the point and the soft symbol $\tilde{S}(m,k)$ among all mapping points.

The above-described embodiment allows the reception apparatus to feedback the data subcarrier that undergoes error correction to the channel estimation unit 102, handles the reliable feedback signal on a par with the pilot subcarrier, and performs repeated channel estimation, thereby enabling reduction in the channel estimation error and improvement in reception performance. The channel estimation unit 102 of this example, which performs initialization to channel estimation (linear interpolation) based on only the pilot subcarrier for each OFDM symbol, is suitable for mobile communications with intense channel variations.

The reception apparatus according to the embodiment of the present invention allows feedback of a signal that undergoes error correction, reduction in the channel estimation error through repeated channel estimation, and improvement in the reception performance. The number of repetitions of channel estimation may be determined to be, for example, twice or three times in advance, or a threshold is defined in advance and channel estimation may be repeated until reliability information becomes equal to or less than the threshold. When the channel variation is gentle, the reception apparatus may store the channel estimation result of past OFDM symbol, smooth the channel estimation result of past OFDM symbol and the estimation result from the pilot subcarrier of current OFDM symbol in a time direction, and then the reception apparatus may use the smoothed estimation result as an initial value for channel estimation this time.

INDUSTRIAL APPLICABILITY

While the present invention has been described in detail above, the present invention is not limited to the reception apparatus described here, and may be widely applicable to reception apparatuses other than the above-described reception apparatus, for example, reception apparatuses that perform block equalization in frequency regions such as discrete Fourier transform spread (DFTS) OFDM, single-carrier frequency-division multiple access (SC-FDMA), and single carrier block transmission with cyclic prefix (CP-SC).

REFERENCE SIGNS LIST

101: FFT unit
102: channel estimation unit
103: equalization unit
104: bit log likelihood ratio calculation unit
105: deinterleave unit
106: soft-in soft-out decoding unit
107: hard decision unit
108: interleave unit
109: soft symbol calculation unit
110: hard decision unit
121: antenna
122: RF unit
123: A/D unit
201: pilot subcarrier extraction unit
202: reliability evaluation unit
203: channel information calculation unit
204: linear interpolation unit

The invention claimed is:

1. A reception apparatus, comprising:
a fast Fourier transform processor that converts a received time signal into a frequency signal;
a pilot subcarrier extractor that extracts pilot subcarriers from the frequency signal;
a channel estimator that estimates a channel between transmission and reception by performing a linear interpolation process on a pilot subcarrier extraction signal extracted by the pilot subcarrier extractor;
an equalizer that performs equalization using the frequency signal and a result of the channel estimator;
a bit log-likelihood ratio calculator that calculates bit log likelihood ratios from an output of the equalizer;
a deinterleaver that rearranges the bit log-likelihood ratios in original order, the deinterleaver making a pair with an interleave section that rearranges the bit log-likelihood ratios in a predetermined order on a transmission side;
a soft-in soft-out decoder that performs error correction in manner of soft-in soft-out on an output of the deinterleaver;
an interleaver that rearranges an encoded bit log-likelihood ratios, in the predetermined order same as the transmission side, out of an output of a section of the soft-in soft-out error correction;
a soft symbol calculator that generates a soft symbol from an output of the interleaver;
a hard decision processor that performs a hard decision on the generated soft symbol; and
a reliability evaluator that generates reliability information from the encoded bit-log likelihood ratio of the output of the interleaver.

2. The reception apparatus of claim 1, wherein the channel estimator comprises a linear interpolation unit that performs the linear interpolation process on an output of the hard decision processor when the reliability information is larger than a predetermined threshold.

3. The reception apparatus of claim 1, wherein the channel estimator repeats the linear interpolation process until the reliability information becomes smaller than a predetermined threshold.

4. The reception apparatus of claim 2, wherein the channel estimator repeats the linear interpolation process until the reliability information becomes smaller than the predetermined threshold.

* * * * *